United States Patent
Cheng et al.

(10) Patent No.: US 10,833,176 B2
(45) Date of Patent: Nov. 10, 2020

(54) SELECTIVELY FORMED GATE SIDEWALL SPACER

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 105 days.

(21) Appl. No.: 15/818,828

(22) Filed: Nov. 21, 2017

(65) Prior Publication Data

US 2018/0076305 A1    Mar. 15, 2018

Related U.S. Application Data

(62) Division of application No. 15/181,946, filed on Jun. 14, 2016, now Pat. No. 9,876,097.

(51) Int. Cl.
*H01L 29/66* (2006.01)
*H01L 21/02* (2006.01)
*H01L 29/78* (2006.01)
*H01L 21/28* (2006.01)
*H01L 29/40* (2006.01)
*H01L 29/49* (2006.01)

(52) U.S. Cl.
CPC .... *H01L 29/66795* (2013.01); *H01L 21/0217* (2013.01); *H01L 21/0228* (2013.01); *H01L 21/02312* (2013.01); *H01L 21/28132* (2013.01); *H01L 29/401* (2013.01); *H01L 29/4966* (2013.01); *H01L 29/66545* (2013.01); *H01L 29/785* (2013.01)

(58) Field of Classification Search
CPC .................................................. H01L 29/7827
See application file for complete search history.

(56) References Cited

U.S. PATENT DOCUMENTS

| | | | |
|---|---|---|---|
| 6,770,516 B2 | 8/2004 | Wu et al. |
| 7,172,792 B2 | 2/2007 | Wang et al. |
| 7,476,578 B1 | 1/2009 | Cheng et al. |
| 7,579,648 B2 | 8/2009 | Yoon et al. |
| 8,174,055 B2 | 5/2012 | Bonser et al. |

(Continued)

OTHER PUBLICATIONS

Kangguo Cheng et al., "Selectively Formed Gate Sidewall Spacer", U.S. Appl. No. 15/181,946, filed Jun. 14, 2016.

(Continued)

*Primary Examiner* — Yu-Hsi D Sun
(74) *Attorney, Agent, or Firm* — Cantor Colburn LLP; Daniel Morris

(57) ABSTRACT

A method for forming a semiconductor device comprises forming a fin on a substrate and forming a sacrificial gate over a channel region of the fin. A hydrogen terminated surface is formed on sidewalls of the sacrificial gate, and a spacer is deposited on the hydrogen terminated surface of the sacrificial gate. An insulator layer is formed over portions of the fin. The sacrificial gate is removed to expose the channel region of the fin, and a gate stack is formed over the channel region of the fin.

8 Claims, 22 Drawing Sheets

(56) References Cited

U.S. PATENT DOCUMENTS

| | | | |
|---|---|---|---|
| 8,716,797 B2 | 5/2014 | Basker et al. | |
| 9,171,927 B2 | 10/2015 | Mehta et al. | |
| 9,276,087 B2 * | 3/2016 | Kim | H01L 29/66545 |
| 2003/0104707 A1 | 6/2003 | Senzaki et al. | |
| 2007/0020879 A1 | 1/2007 | Baek et al. | |
| 2015/0115371 A1 | 4/2015 | Ganz et al. | |

OTHER PUBLICATIONS

List of IBM Patents or Patent Applications Treated as Related; (Appendix P), Filed Nov. 21, 2017; 2 pages.
Dumas, P. et al., "Morphology of hydrogen-terminated Si (111) and Si (100) surfaces upon etching in HF and buffered-HF solutions," Surface Science, vol. 269/270, 1992, pp. 867-878.
Yokoyama, S. et al., "Atomic-layer selective deposition of silicon nitride on hydrogen-terminated Si surfaces," Applied Surface Science, vol. 130-132, 1998, pp. 352-356.

* cited by examiner

US 10,833,176 B2

SELECTIVELY FORMED GATE SIDEWALL SPACER

DOMESTIC PRIORITY

This application is a continuation of and claims priority from U.S. patent application Ser. No. 15/181,946, filed on Jun. 14, 2016, entitled "SELECTIVELY FORMED GATE SIDEWALL SPACER," the content of which are incorporated herein by reference in its entirety.

BACKGROUND

The present invention generally relates to complimentary metal-oxide semiconductors (CMOS) and metal-oxide-semiconductor field-effect transistors (MOSFET), and more specifically, to finFET device fabrication.

The MOSFET is a transistor used for switching electronic signals. The MOSFET has a source, a drain and a gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET has n-doped source and drain junctions and uses electrons as the current carriers. The pFET has p-doped source and drain junctions and uses holes as the current carriers.

The finFET is a type of MOSFET. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Since the fin provides a three dimensional surface for the channel region, a larger channel length may be achieved in a given region of the substrate as opposed to a planar FET device.

Gate spacers form an insulating film along the gate sidewalls. Gate spacers may also initially be formed along sacrificial gate sidewalls in replacement gate technology. The gate spacers are used to define source/drain regions in active areas of a semiconductor channel layer located adjacent to the gate.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming a semiconductor device comprises forming a fin on a substrate and forming a sacrificial gate over a channel region of the fin. A hydrogen terminated surface is formed on sidewalls of the sacrificial gate, and a spacer is deposited on the hydrogen terminated surface of the sacrificial gate. An insulator layer is formed over portions of the fin. The sacrificial gate is removed to expose the channel region of the fin, and a gate stack is formed over the channel region of the fin.

According to another embodiment of the present invention, a method for forming a semiconductor device comprises forming a fin on an insulator layer, forming an oxide layer over the fin, depositing a layer of polysilicon over the fin and the insulator layer, and forming a hardmask on the layer of polysilicon. Portions of the hardmask and the layer of polysilicon are removed to form a sacrificial gate with a hardmask arranged on the sacrificial gate. A hydrogen terminated surface is formed on sidewalls of the sacrificial gate, and a spacer is deposited on the hydrogen terminated surface of the sacrificial gate. An insulator material is formed over exposed portions of the fin and the insulator layer. The hardmask and the sacrificial gate are removed to expose a channel region of the fin. A gate stack is formed over the channel region of the fin.

According to yet another embodiment of the present invention, a semiconductor device comprises a semiconductor fin arranged on a substrate and an oxide layer arranged on the semiconductor fin. A gate stack is arranged over a channel region of the semiconductor fin and a spacer is arranged adjacent to the gate stack on the oxide layer. A source/drain region is arranged adjacent to the spacer.

BRIEF DESCRIPTION OF THE DRAWINGS

FIGS. 1A-3 illustrate an example of forming spacers along the sidewalls of a sacrificial gate.

FIG. 1A illustrates a cut-away view of a semiconductor fin arranged on a substrate.

FIG. 2 illustrates a cut-away view following the deposition of a layer of spacer material over the substrate, the semiconductor fin, and the sacrificial gate.

FIG. 3 illustrates a cut-away view following an anisotropic etching process that removes exposed portions of the layer of spacer material.

FIG. 4 illustrates a cut-away view of the sacrificial gates that are arranged on the semiconductor fin.

FIG. 5 illustrates a cut-away view following the deposition of a layer of spacer material over the substrate, the semiconductor fin, the sacrificial gate and the hardmask.

FIG. 6 illustrates a cut-away view following an anisotropic etching process that removes portions of the layer of spacer material.

FIGS. 7-19B Illustrate an exemplary method for forming a finFET device with sidewall spacers.

FIG. 7 illustrates a side view of a semiconductor-on-insulator (SOI) wafer.

FIG. 9 illustrates a cut-away view following the deposition of an oxide layer over the insulator layer and the fin.

FIG. 10 illustrates a cut-away view following the deposition of a layer of sacrificial gate material.

FIG. 12 illustrates a cut-away view following the formation of a hydrogen (H) terminated surface on the exposed sidewalls of the sacrificial gates FIG. 13 illustrates a cut-away view following the formation of spacers on the hydrogen-terminated surfaces.

FIG. 14 illustrates a top view following the removal of exposed portions of the oxide layer (of FIG. 13).

FIG. 15 illustrates a top view following the formation of source/drain regions.

FIG. 17 illustrates a top view following a planarization process.

FIG. 18 illustrates a top view of the resultant structure following the removal of the sacrificial gates (of FIG. 17) to form cavities that expose the channel regions of the fins.

FIG. 19B illustrates a cut-away view of the gate stack along the line C-C (of FIG. 19A).

DETAILED DESCRIPTION

Often in finFET device fabrication, a sacrificial gate is formed over a channel region of a semiconductor fin. Spacers are formed along sidewalls of the sacrificial gate. The spacers are often formed by depositing a layer of spacer material over the sacrificial gate. An anisotropic etching process is performed to remove portions of the layer of spacer material generally arranged orthogonally with respect to the sacrificial gate.

Figure 1A:
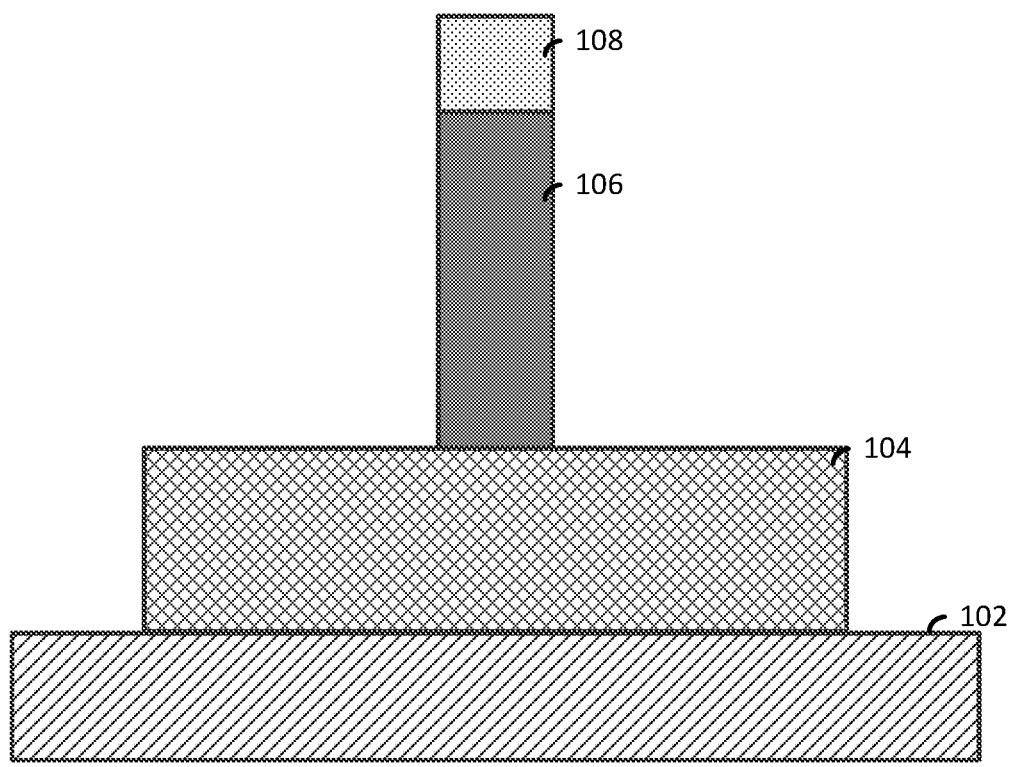
Figure 1B:
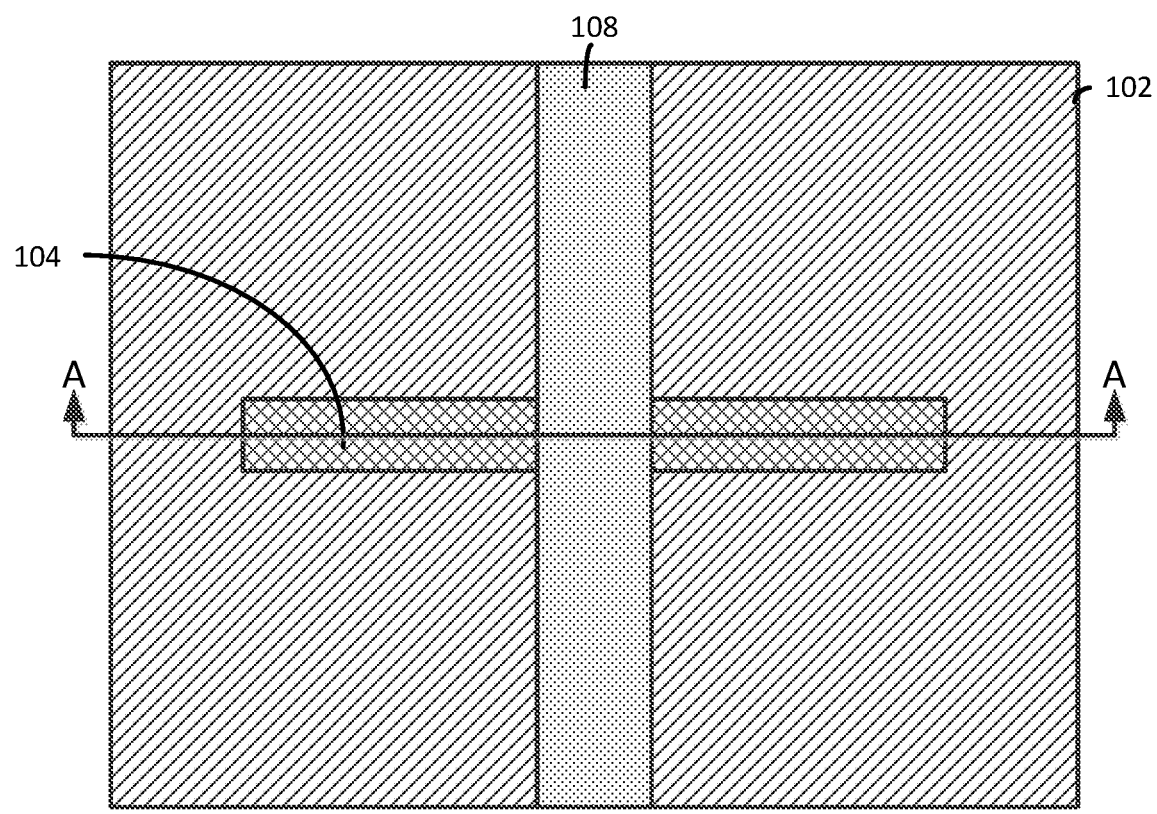
FIG. 1B illustrates a top view of the semiconductor fin arranged on the substrate.

In this regard, FIGS. 1A-3 illustrate an example of forming spacers along the sidewalls of a sacrificial gate. FIG. 1A illustrates a cut-away view of a semiconductor fin 104 arranged on a substrate 102. A sacrificial gate 106 and hardmask 108 are arranged over a channel region of the semiconductor fin 104. The sacrificial gate 106 is formed by lithographically patterning and etching to remove portions of the hardmask 108 and underlying portions of the semiconductor fin material. The sidewalls of the sacrificial gate 106 are generally flush with the edges of the sacrificial gate 106. FIG. 1B illustrates a top view of the semiconductor fin 104 arranged on the substrate 102.

Figure 2:
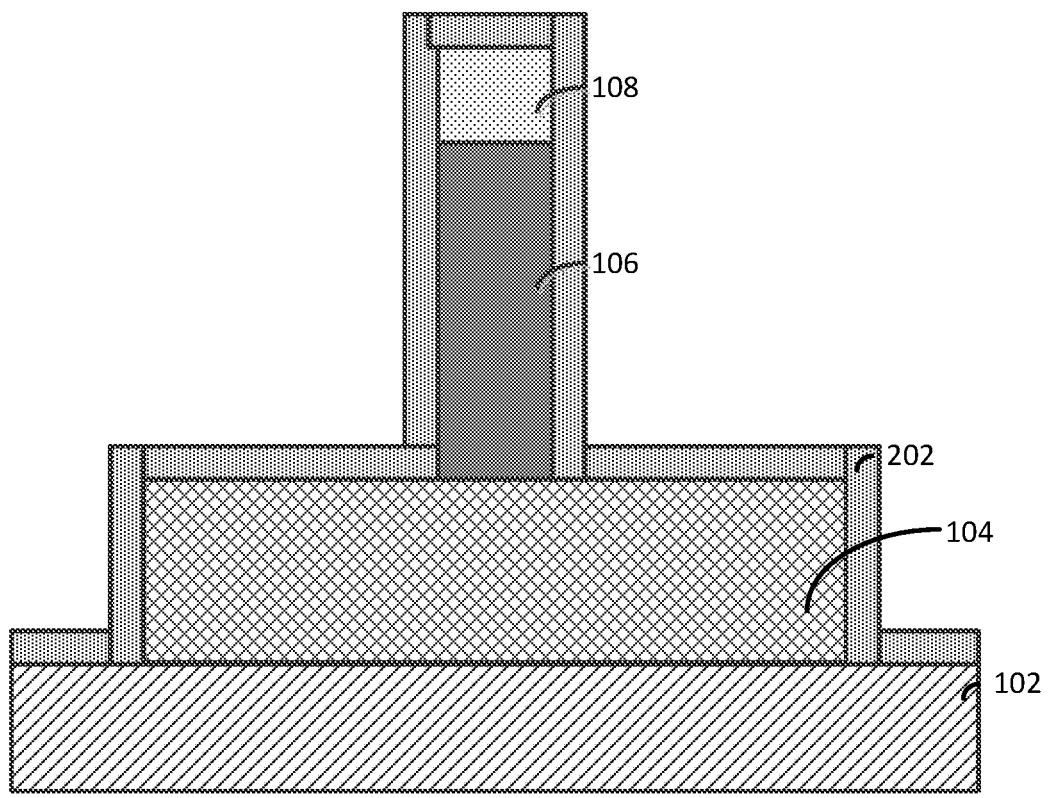

FIG. 2 illustrates a cut-away view following the deposition of a layer of spacer material 202 over the substrate 102, the semiconductor fin 104, and the sacrificial gate 106.

Figure 3:
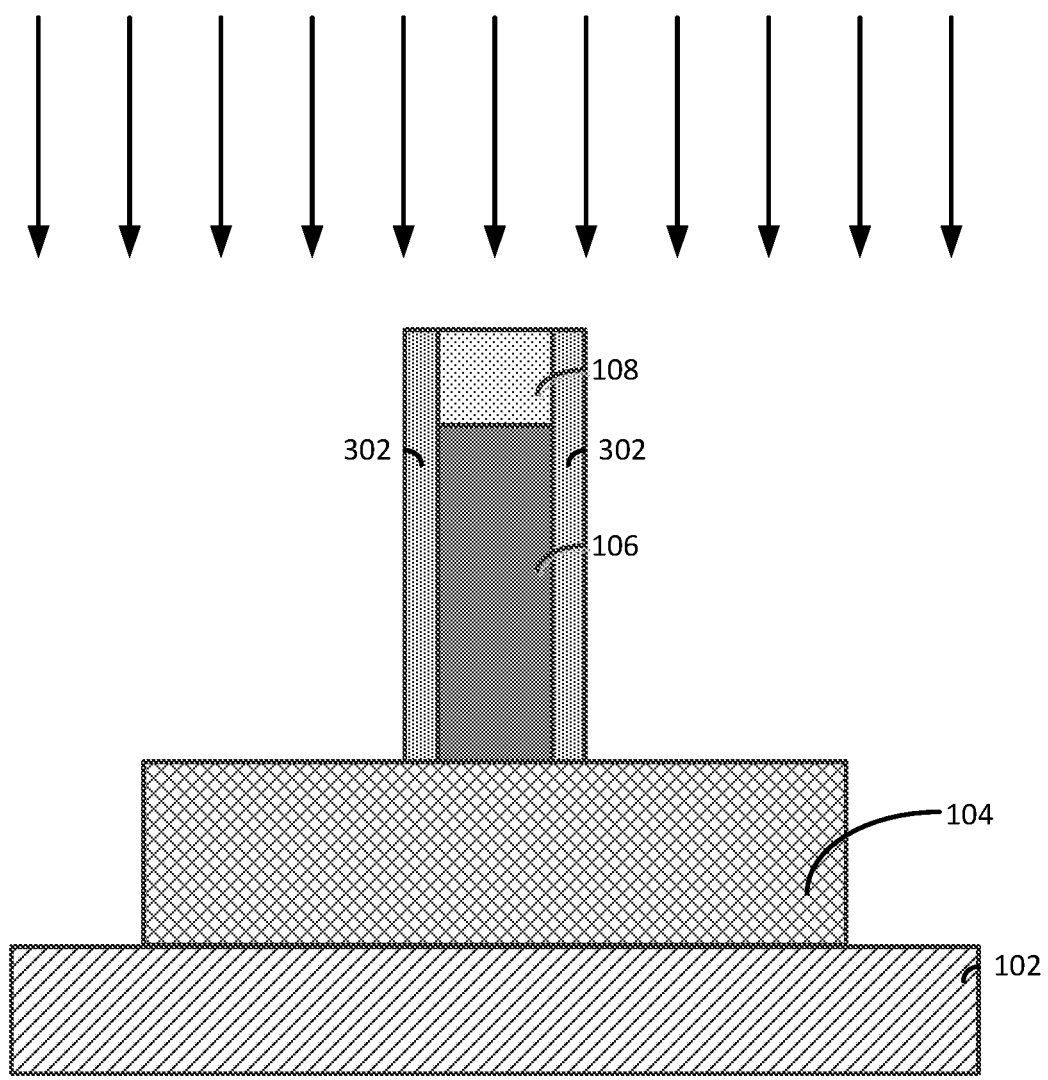

FIG. 3 illustrates a cut-away view following an anisotropic etching process that removes exposed portions of the layer of spacer material 202 (of FIG. 2) to form spacers 302 along sidewalls of the sacrificial gate 106.

Figure 4:
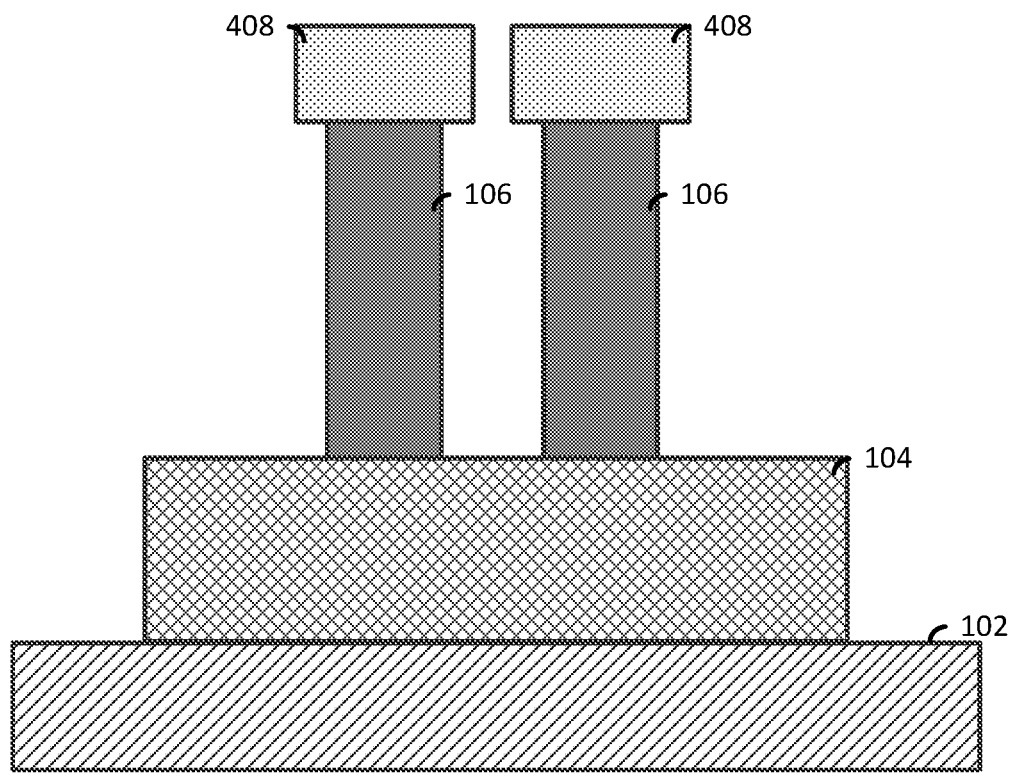
FIGS. 4-6 illustrate another example of forming spacers along sidewalls of a sacrificial gate where the pitch of the sacrificial gates is high.
Figure 5:
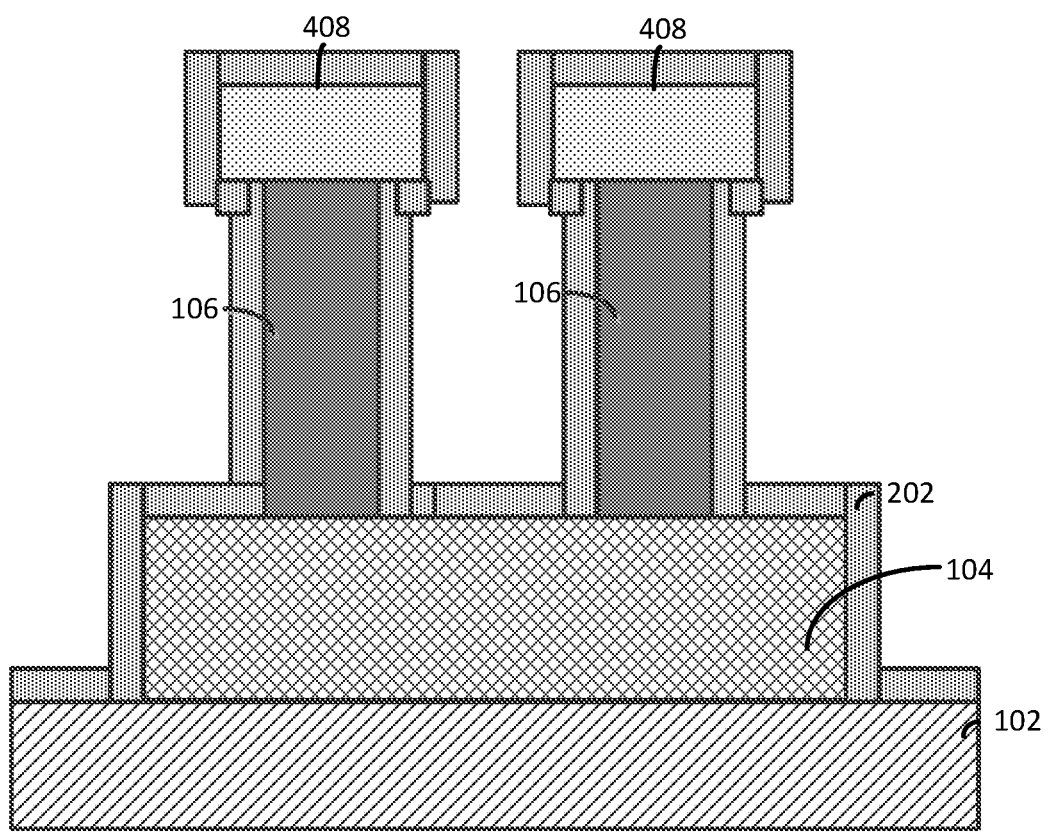
Figure 6:
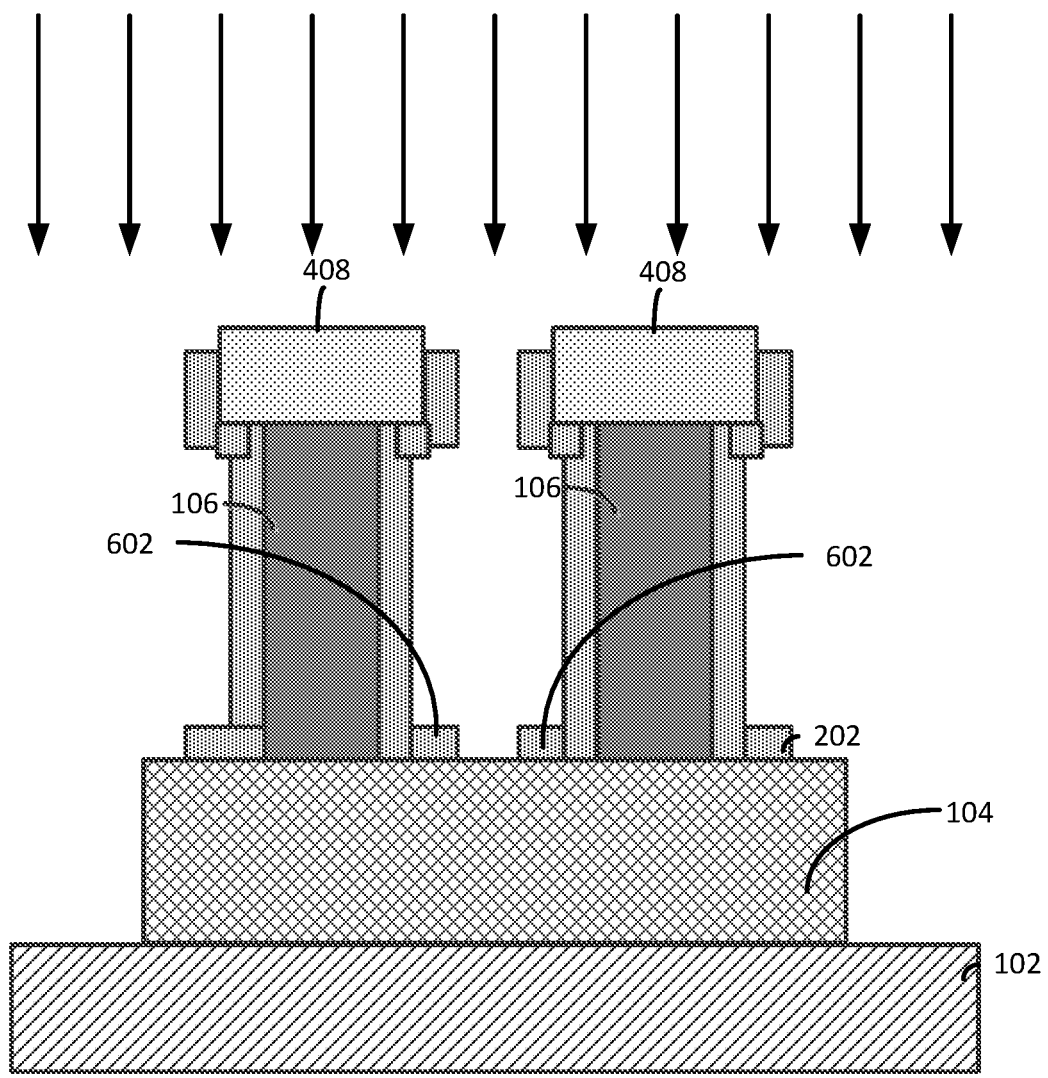

FIGS. 4-6 illustrate another example of forming spacers along sidewalls of a sacrificial gate where the sacrificial gate is tall. Referring to FIG. 4, the sacrificial gates 106 are arranged on the semiconductor fin 104 and the hardmask 408 is arranged on the sacrificial gate 106. However, in the illustrated example, the sidewalls of the sacrificial gate 106 are not flush with the edges of the hardmask 408. This arrangement results when the anisotropic etching process removes sacrificial gate material from under the hardmask 408. Anisotropic etching processes generally do not etch with perfect directionality. The lateral etch (removal of sidewall material) of sacrificial gate becomes more pronounced as the gate height increases.

FIG. 5 illustrates a cut-away view following the deposition of a layer of spacer material 202 over the substrate 102, the semiconductor fin 104, the sacrificial gate 106 and the hardmask 408.

FIG. 6 illustrates a cut-away view following an anisotropic etching process that removes portions of the layer of spacer material. In the illustrated example portions 602 of the layer of spacer material remain un-etched between the sacrificial gates 106 due to the greater widths of the hardmasks 408 compared to widths of the sacrificial gate 106. The etching process does not sufficiently remove portions of the layer of spacer material to form the desired spacer arrangement. The portions 602 remain on the semiconductor fin 104, and are undesirable since they obscure active regions of the semiconductor fin 602. This may reduce the performance of the resultant finFET devices.

FIGS. 7-19B Illustrate an exemplary method for forming a finFET device with sidewall spacers.

Figure 7:
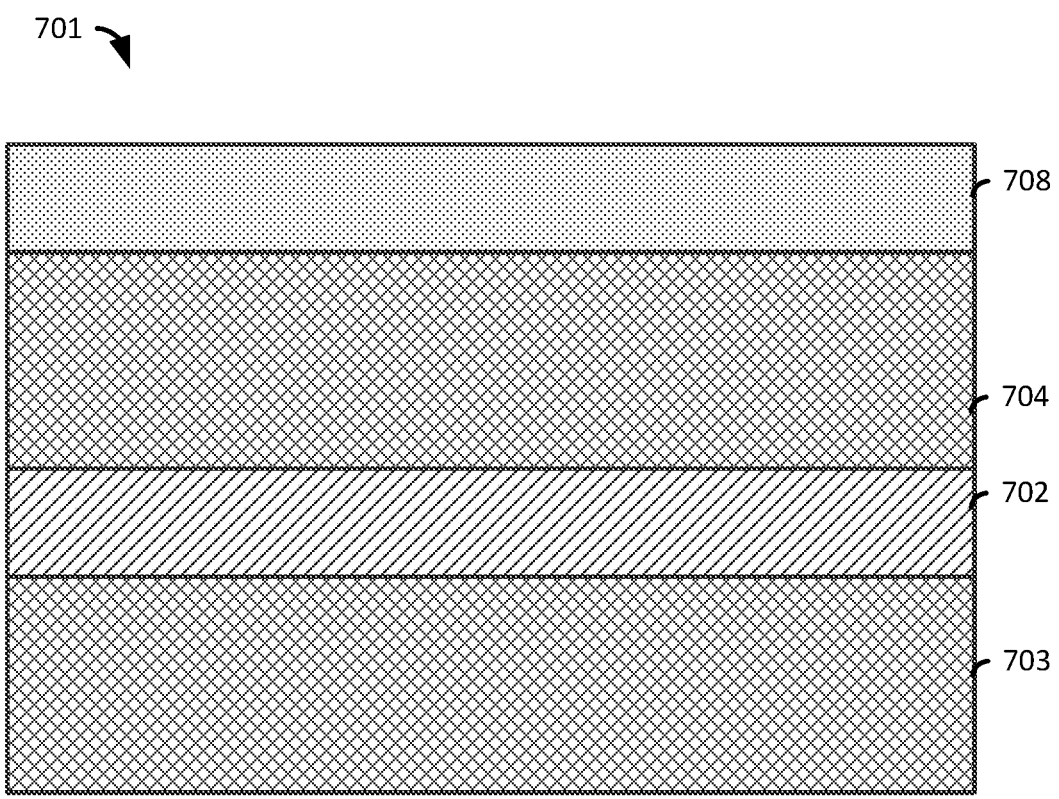

FIG. 7 illustrates a side view of a semiconductor-on-insulator (SOI) wafer 701. The SOI wafer 701 includes a substrate 703, an insulator layer 702 arranged on the substrate, and a semiconductor channel layer 704 arranged on the insulator layer 702. The SOI wafer 701 can be formed by any suitable technique such as, for example wafer bonding, Smartcut™, SIMOX (Separation by IMplanted Oxygen). Though the illustrated exemplary embodiment includes a semiconductor-on-insulator wafer 701 alternate exemplary embodiments may be formed using, for example, a bulk semiconductor substrate.

The semiconductor channel layer 704 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor channel layer may also comprise an organic semiconductor or a layered semiconductor such as, for example, Si/SiGe, a silicon-on-insulator or a SiGe-on-insulator. A portion or entire semiconductor channel layer may be amorphous, polycrystalline, or monocrystalline. In addition to the aforementioned types of semiconductor channel layers, the semiconductor channel layer employed in the present invention may also comprise a hybrid oriented (HOT) semiconductor channel layer in which the HOT substrate has surface regions of different crystallographic orientation. The semiconductor channel layer may be doped, undoped or contain doped regions and undoped regions therein. The semiconductor channel layer may contain regions with strain and regions without strain therein, or contain regions of tensile strain and compressive strain.

The insulator layer 702 may include, for example, a buried oxide (BOX) material or other suitable insulator materials. Examples of suitable insulator materials include, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The thickness of insulator layer 702 generally varies and is not intended to be limited. In one aspect, the thickness of the insulator layer 702 is in a range from about 10 nm to about 1000 nm. The insulator layer 702 can be formed by any suitable process such as thermal oxidation, thermal nitridation, chemical vapor deposition (CVD).

A hardmask layer 708 is arranged on the semiconductor channel layer 704. The hardmask layer 708 may include, for example, silicon oxide, silicon nitride (SiN), SiOCN, SiBCN or any suitable combination of those. The hardmask layer 708 may be deposited using a deposition process, including, but not limited to, PVD, CVD, PECVD, or any combination thereof.

Figure 8A:
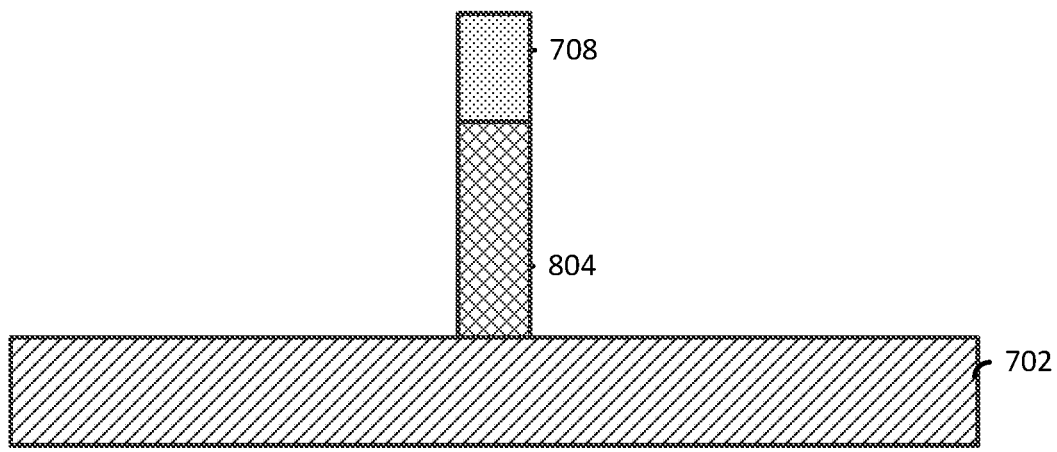
FIG. 8A illustrates a cut-away view along the line A-A (of FIG. 8B) following the formation of fins on the insulator layer.
Figure 8B:
FIG. 8B illustrates a top view of the fin 804 arranged on the insulator layer.
Figure 8B:
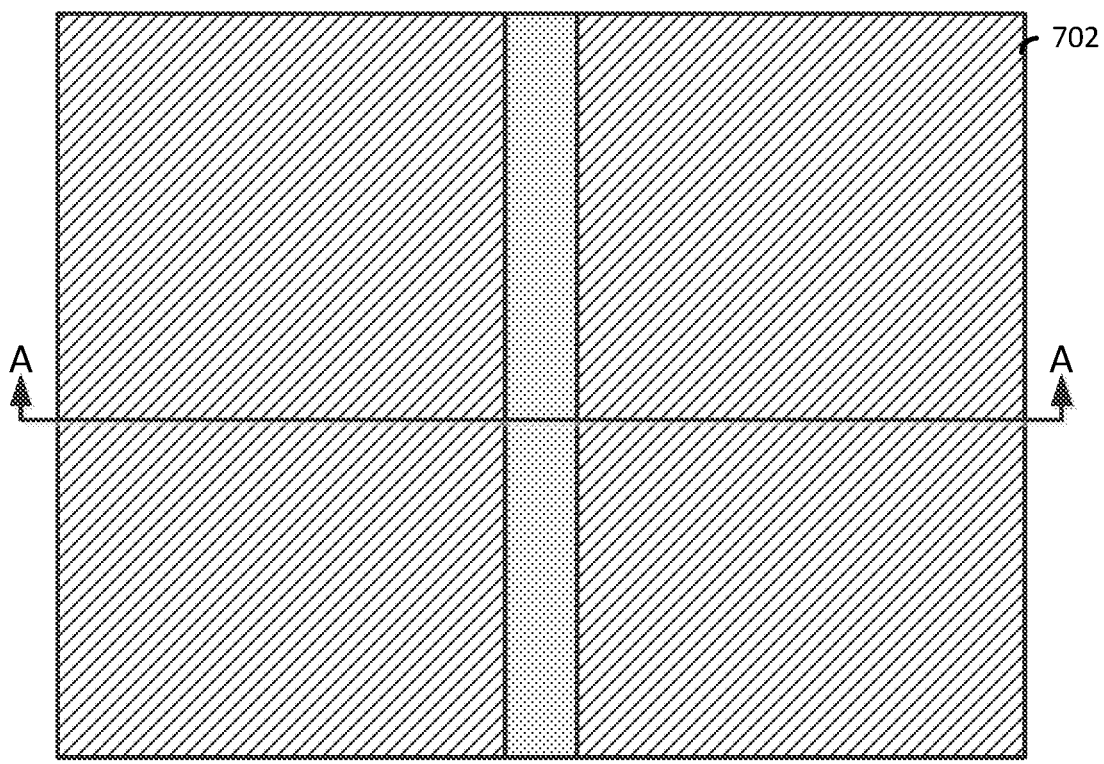

FIG. 8A illustrates a cut-away view along the line A-A (of FIG. 8B) following the formation of fins 804 on the insulator layer 702. The fins 804 may be patterned by, for example, a lithographic patterning and etching process such as, reactive ion etching (RIE) or a sidewall imaging transfer process that removes exposed portions of the hardmask layer 708 and portions of the semiconductor channel layer 704 to expose portions of the insulator layer 702. FIG. 8B illustrates a top view of the fin 804 arranged on the insulator layer 702. For clarity and simplicity, the substrate 703 (of FIG. 7 has been omitted from the subsequent figures.)

Figure 9:
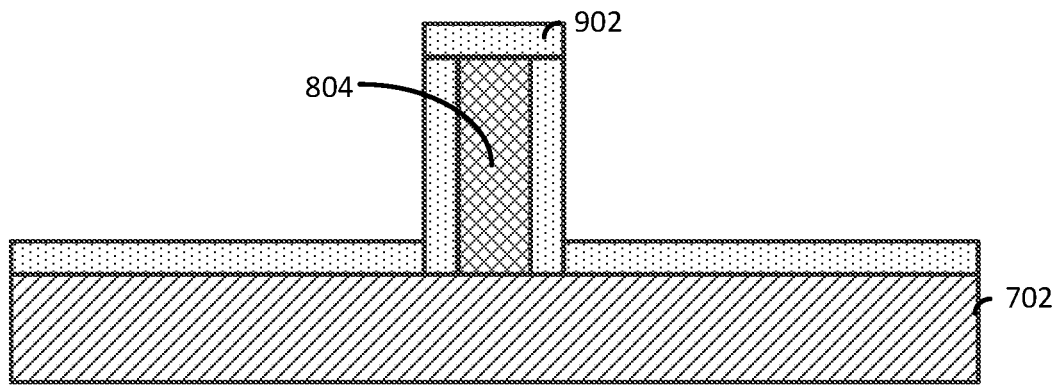

FIG. 9 illustrates a cut-away view following the deposition of an oxide layer 902 over the insulator layer 702 and the fin 804. The hardmask layer 708 (of FIG. 8A) has been removed prior to depositing the oxide layer 902. Non-limiting examples of oxides include silicon dioxide, tetra-ethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 10:
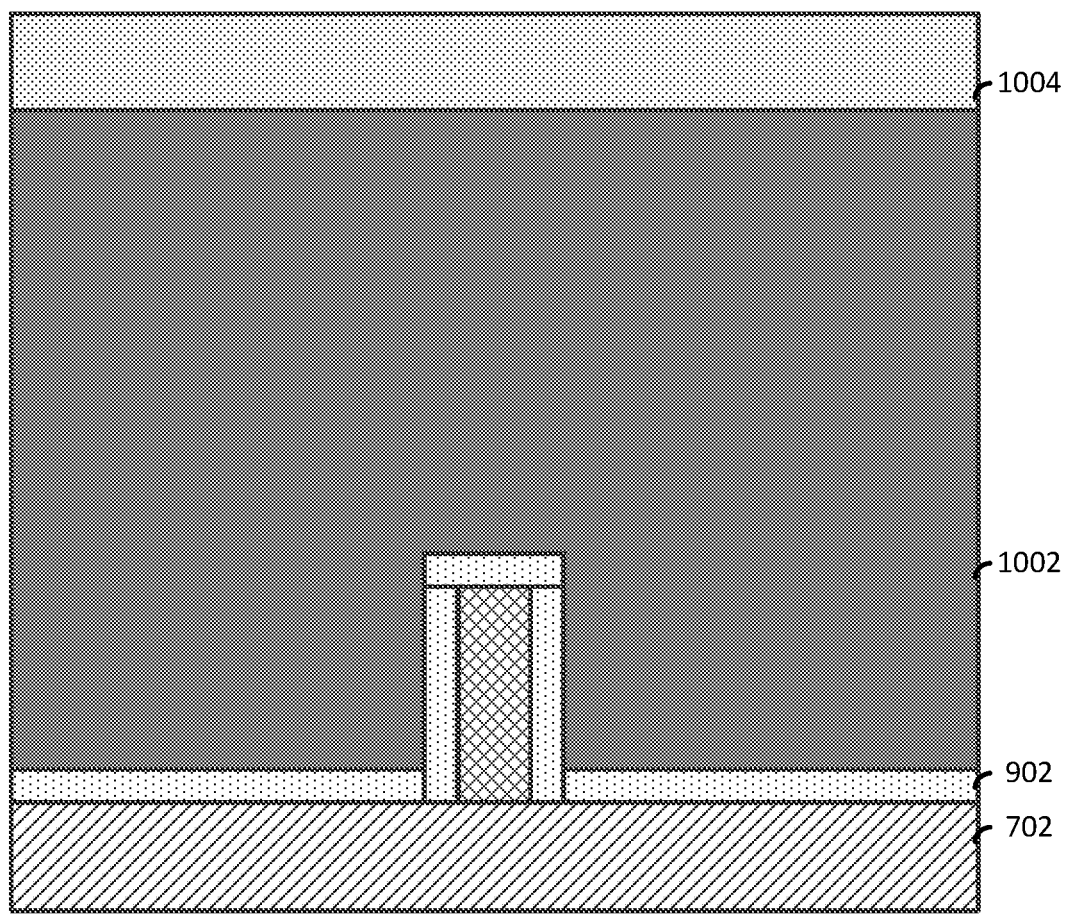

FIG. 10 illustrates a cut-away view following the deposition of a layer of sacrificial gate material 1002. The layer of sacrificial gate material 1002 may include, for example, amorphous silicon (aSi), or polycrystalline silicon (polysilicon) material or another suitable sacrificial gate material. The layer sacrificial gate material 1002 may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer 1004 such as, for example, silicon oxide, silicon nitride (SiN), SiOCN, SiBCN or any suitable combination of those materials, is deposited on the layer of sacrificial gate material 1002. The hardmask layer 1004 may be deposited using a deposition process, including, but not limited to, PVD, CVD, PECVD, or any combination thereof.

Figure 11A:
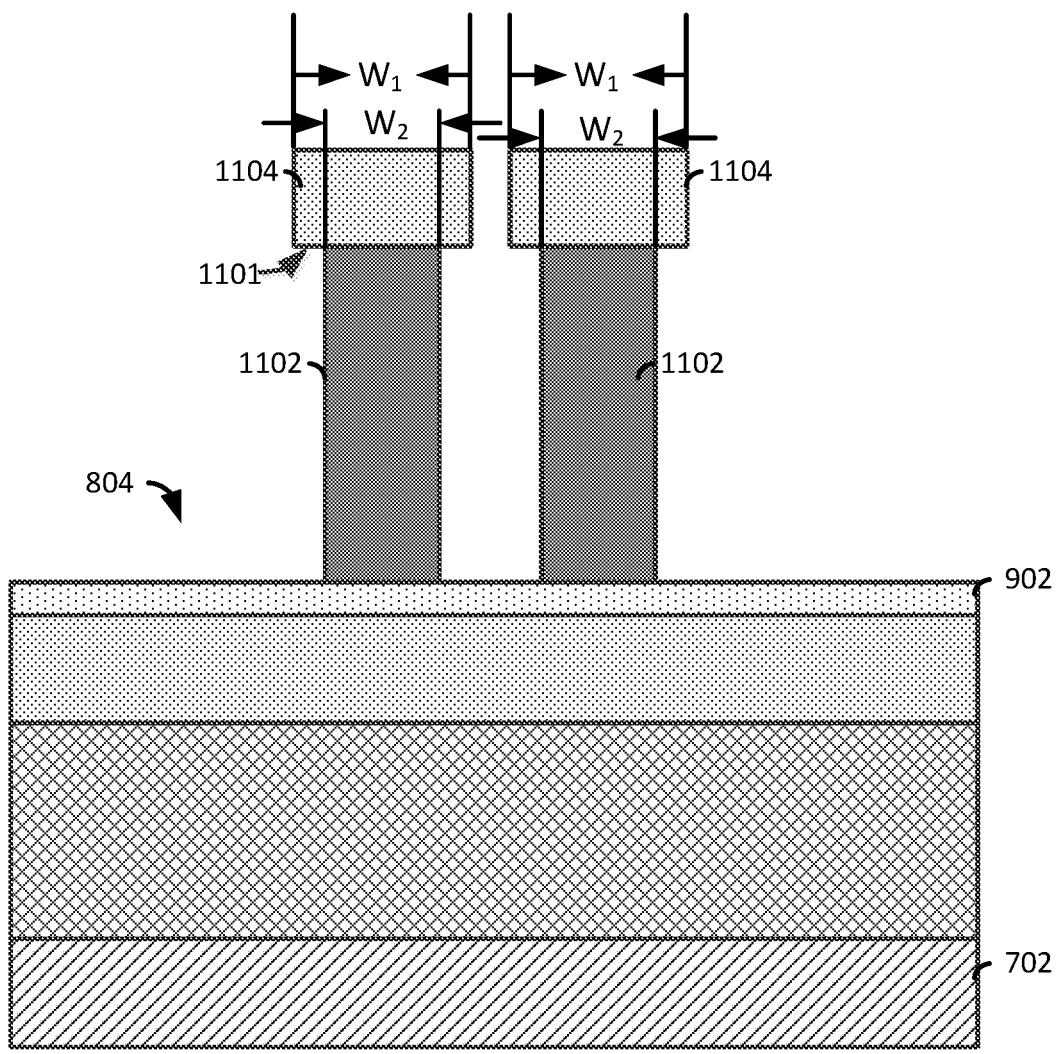
FIG. 11A illustrates a cut-away view along the line B-B (of FIG. 11B) following a lithographic patterning and etching process.
Figure 11B:
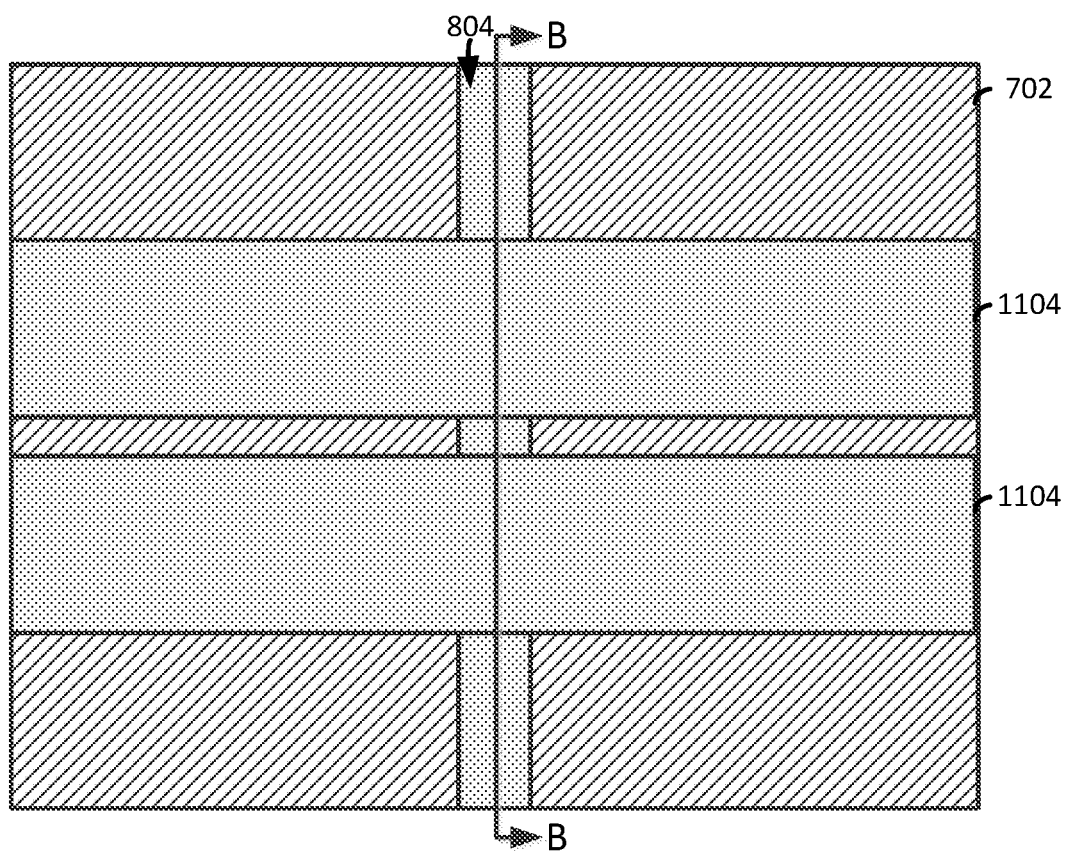
FIG. 11B illustrates a top view following the formation of the sacrificial gates.

FIG. 11A illustrates a cut-away view along the line B-B (of FIG. 11B) following a lithographic patterning and etching process such as, for example, reactive ion etching or a wet etching process that is performed to remove exposed portions of the hardmask layer 1004 (of FIG. 10) and the layer of sacrificial gate material 1002 form the sacrificial gates 1102 and the sacrificial gate caps 1104. In the illustrated exemplary embodiment, the sacrificial gates 1102 have a width $W_2$ and the sacrificial gate caps 1104 have a width $W_1$, where $W_1 > W_2$. This defines an over-hang region 1101 where the width of the sacrificial gate caps 1104 is greater than the width of the sacrificial gates 1102. FIG. 11B illustrates a top view following the formation of the sacrificial gates 1102.

Figure 12:
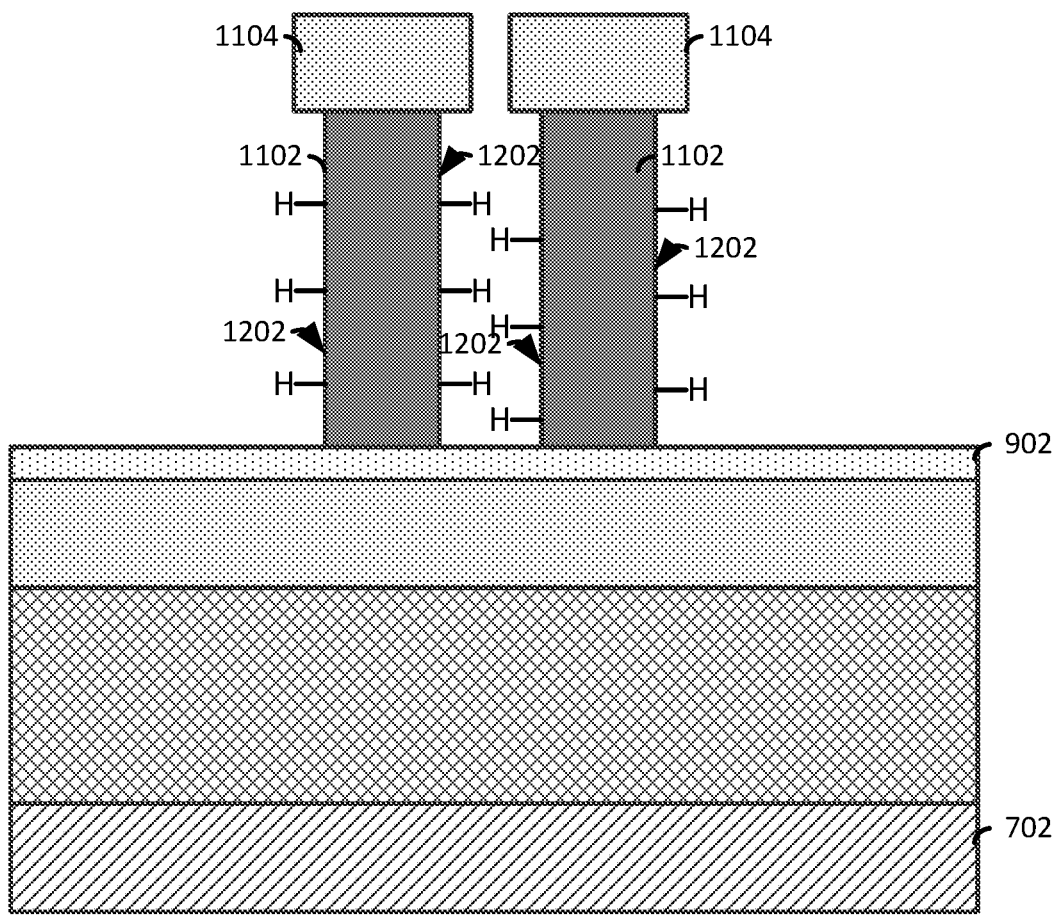

FIG. 12 illustrates a cut-away view following the formation of a hydrogen (H) terminated surface 1202 on the exposed sidewalls of the sacrificial gates 1102. In this regard, the hydrogen-terminated surfaces 1202 are formed by performing an annealing process in $H_2$ ambience. The H-terminated surface will only be formed on Si surface because dangling bonds are present on the exposed Si surface. The process results in the hydrogen-terminated surfaces 1202 on exposed portions of the sacrificial gates 1102.

Figure 13:
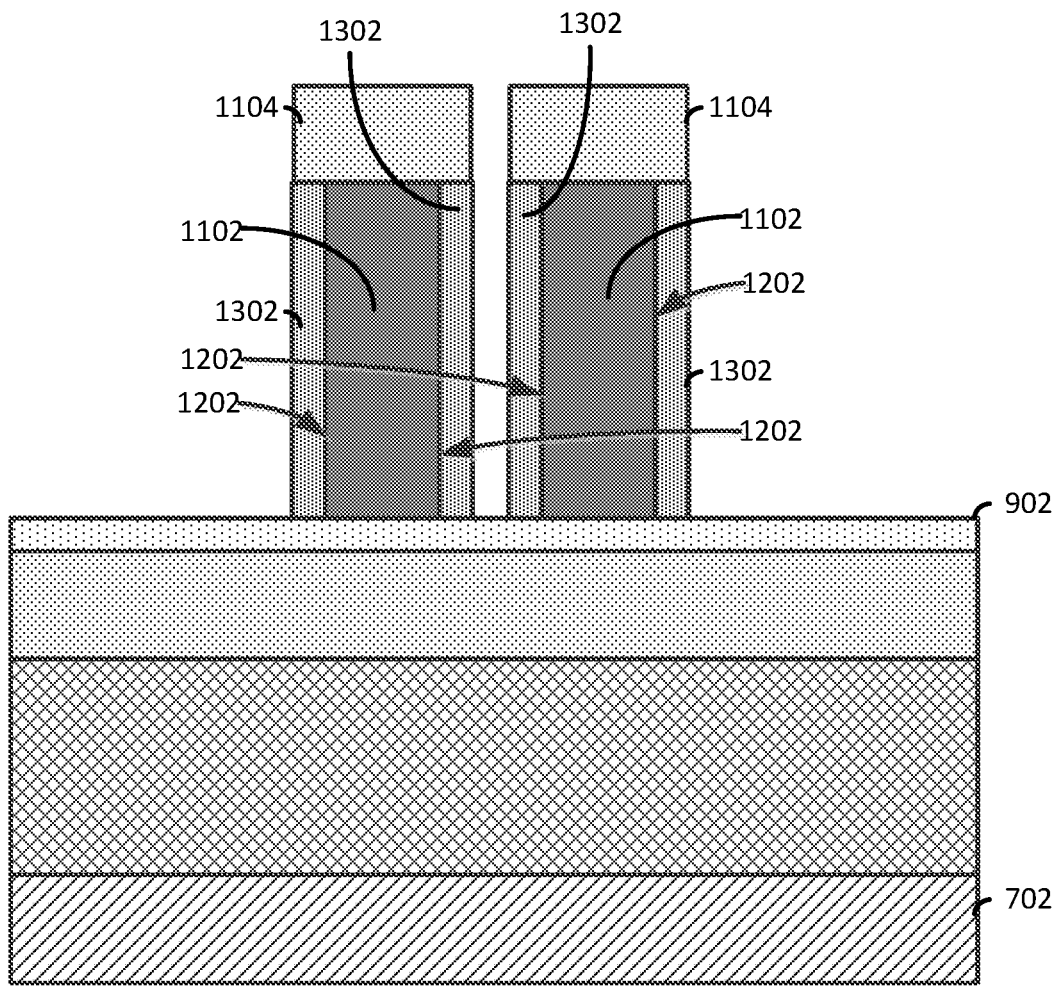

FIG. 13 illustrates a cut-away view following the formation of spacers 1302 on the hydrogen-terminated surfaces 1202. The spacers 1302 are formed using, for example, an atomic layer deposition (ALD) process that selectively deposits a nitride material such as, for example, silicon nitride on exposed hydrogen-terminated surfaces 1202.

Figure 14:
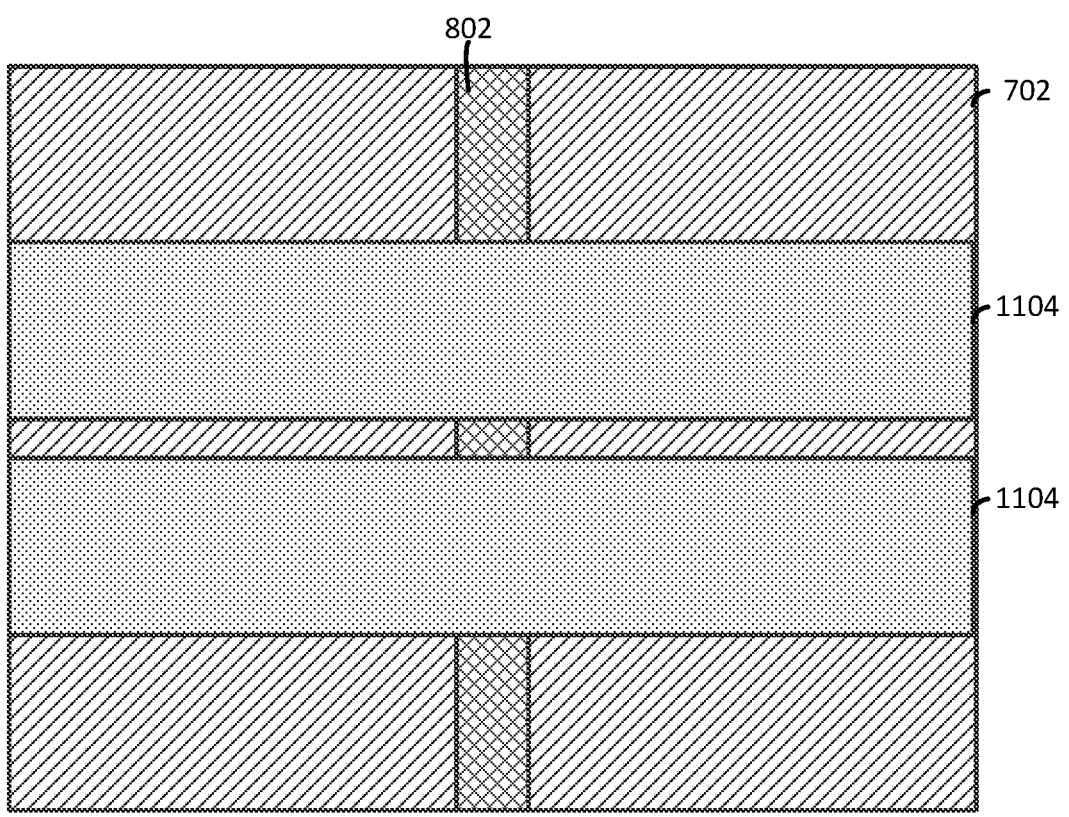

FIG. 14 illustrates a top view following the removal of exposed portions of the oxide layer 902 (of FIG. 13).

Figure 15:
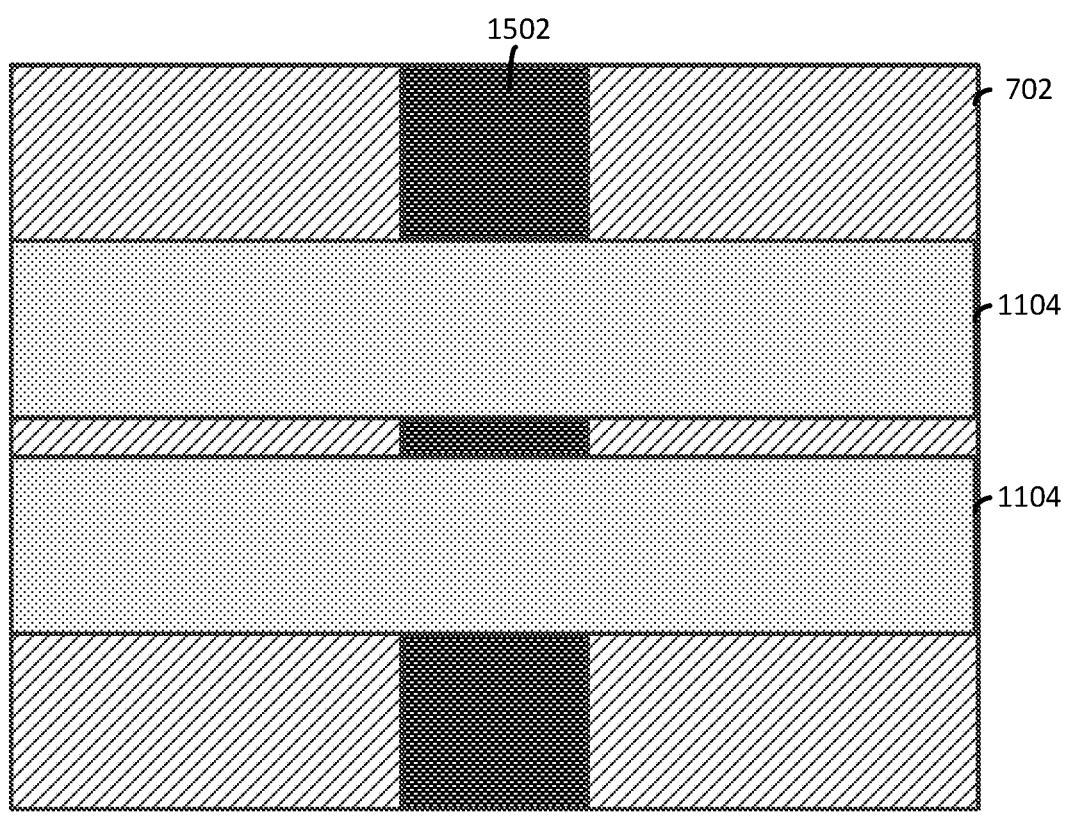

FIG. 15 illustrates a top view following the formation of source/drain regions 1502. The source/drain regions 1502 are formed by an epitaxial growth process that deposits a crystalline overlayer of semiconductor material onto the exposed crystalline seed material of the exposed fin 804 to form the source/drain regions 1502.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ to $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor channel layer with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 16A:
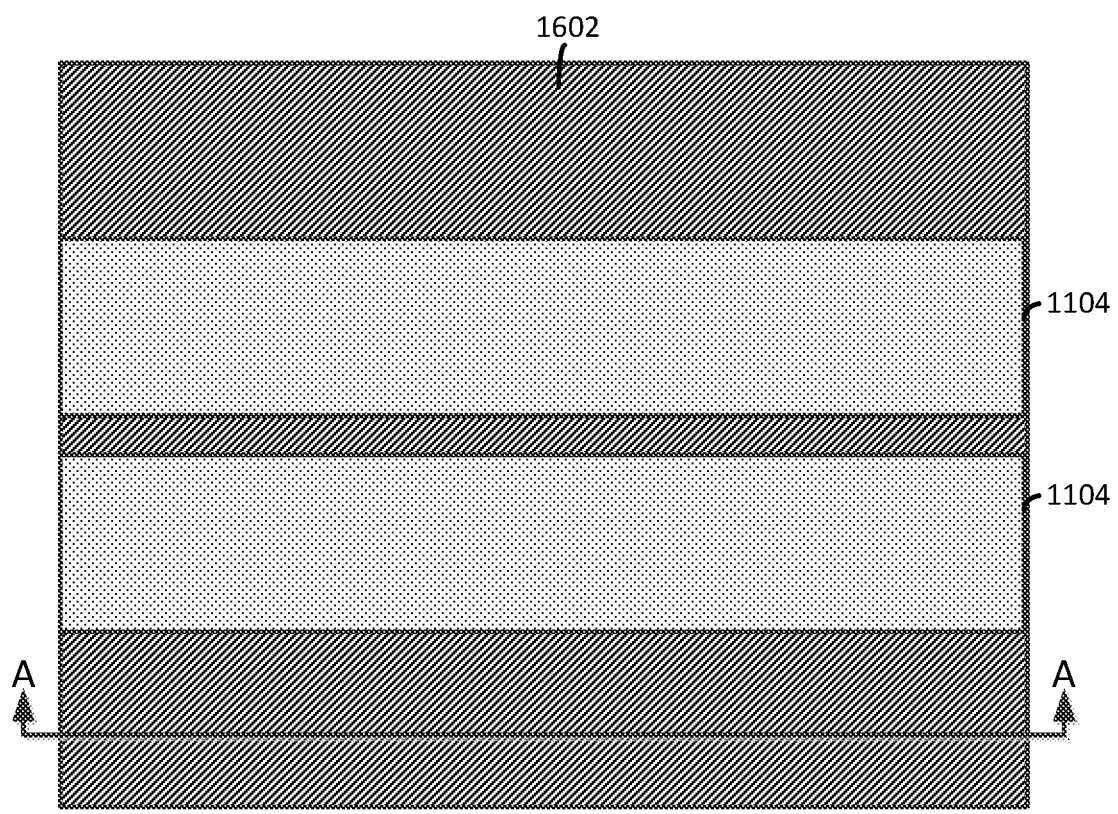
FIG. 16A illustrates a top view following the deposition of an inter-level dielectric layer over the source/drain regions and portions of the insulating layer.

FIG. 16A illustrates a top view following the deposition of an inter-level dielectric layer 1602 over the source/drain regions 1502 and portions of the insulating layer 702.

Figure 16B:
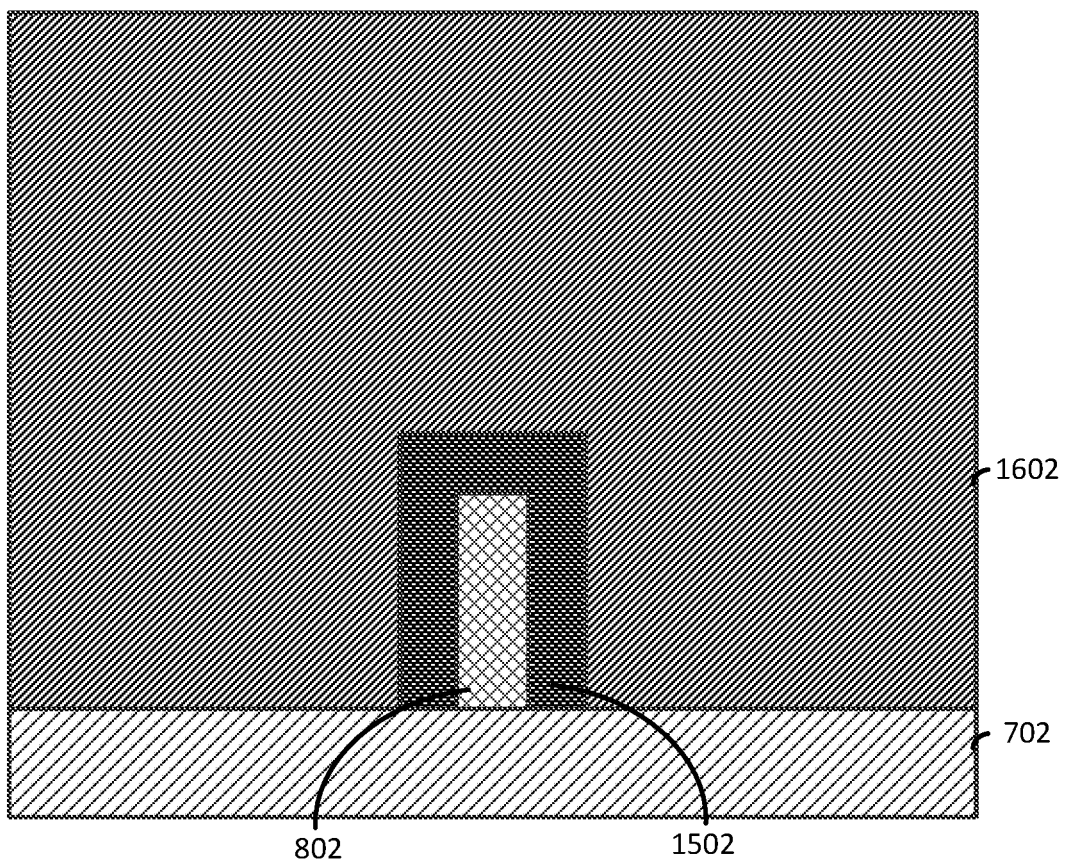
FIG. 16B illustrates a cut-away view along the line A-A (of FIG. 16A) showing the fin, the source/drain region, and the inter-level dielectric layer.

The inter-level dielectric layer 1602 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1602 is deposited by a deposition process, including, but not limited to CVD, PVD, plasma enhanced CVD, atomic layer deposition (ALD), evaporation, chemical solution deposition, or like processes. FIG. 16B illustrates a cut-away view along the line A-A (of FIG. 16A) showing the fin 802, the source/drain region 1502, and the inter-level dielectric layer 1602.

Figure 17:
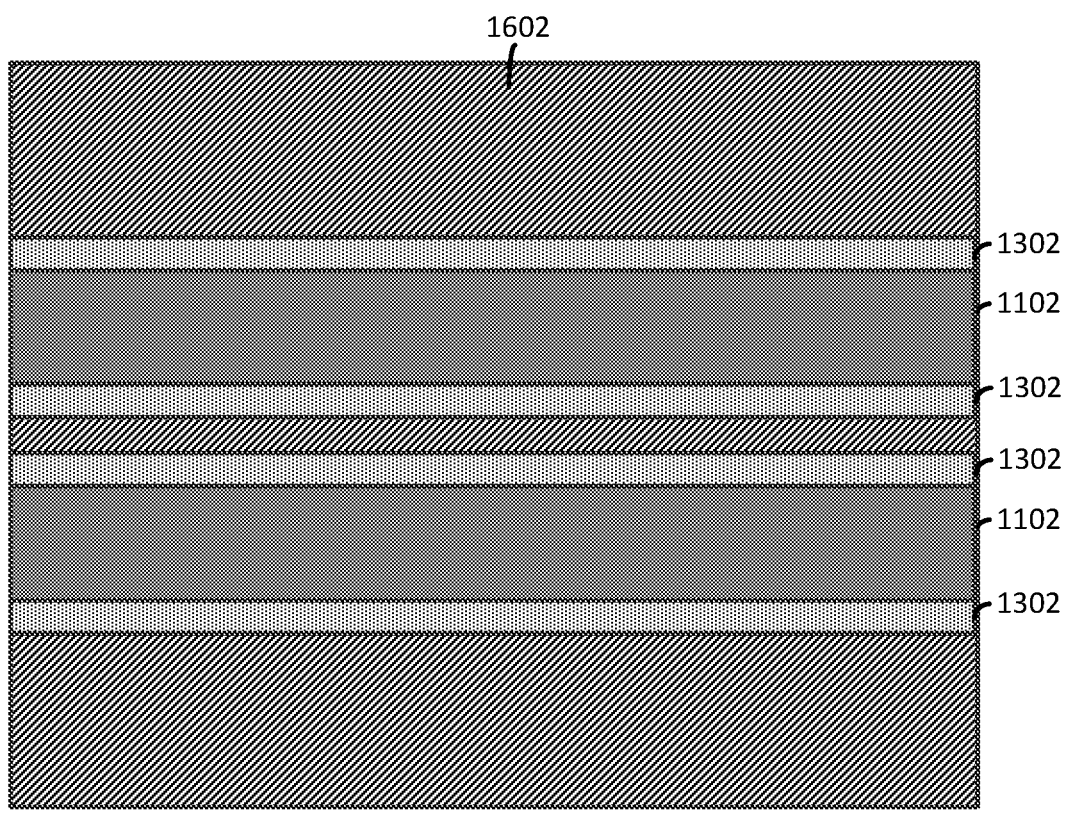

FIG. 17 illustrates a top view following a planarization process such as, for example, chemical mechanical polishing. The planarization process removes portions of the inter-level dielectric layer 1602 and the hardmask layer 1104 (of FIG. 16A) to expose the sacrificial gates 1102 and the spacers 1302.

Figure 18:
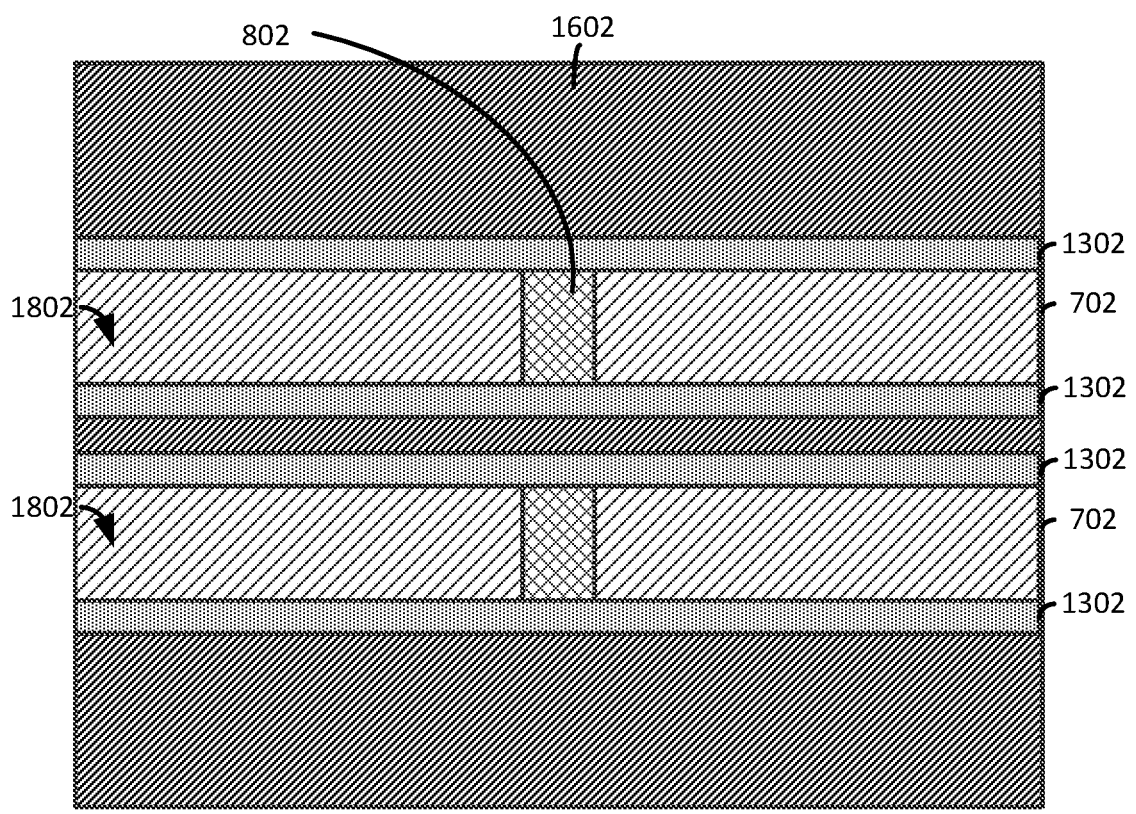

FIG. 18 illustrates a top view of the resultant structure following the removal of the sacrificial gates 1102 (of FIG. 17) to form cavities 1802 that expose the channel regions of the fins 802. The sacrificial gates 1102 may be removed by performing a dry etch process, for example, RIE, followed by a wet etch process. The wet etch process is selective to (will not substantially etch) the spacers 1302 and the inter-level dielectric material. The chemical etch process may include, but is not limited to, hot ammonia or tetramethyl-ammonium hydroxide (TMAH).

Figure 19A:
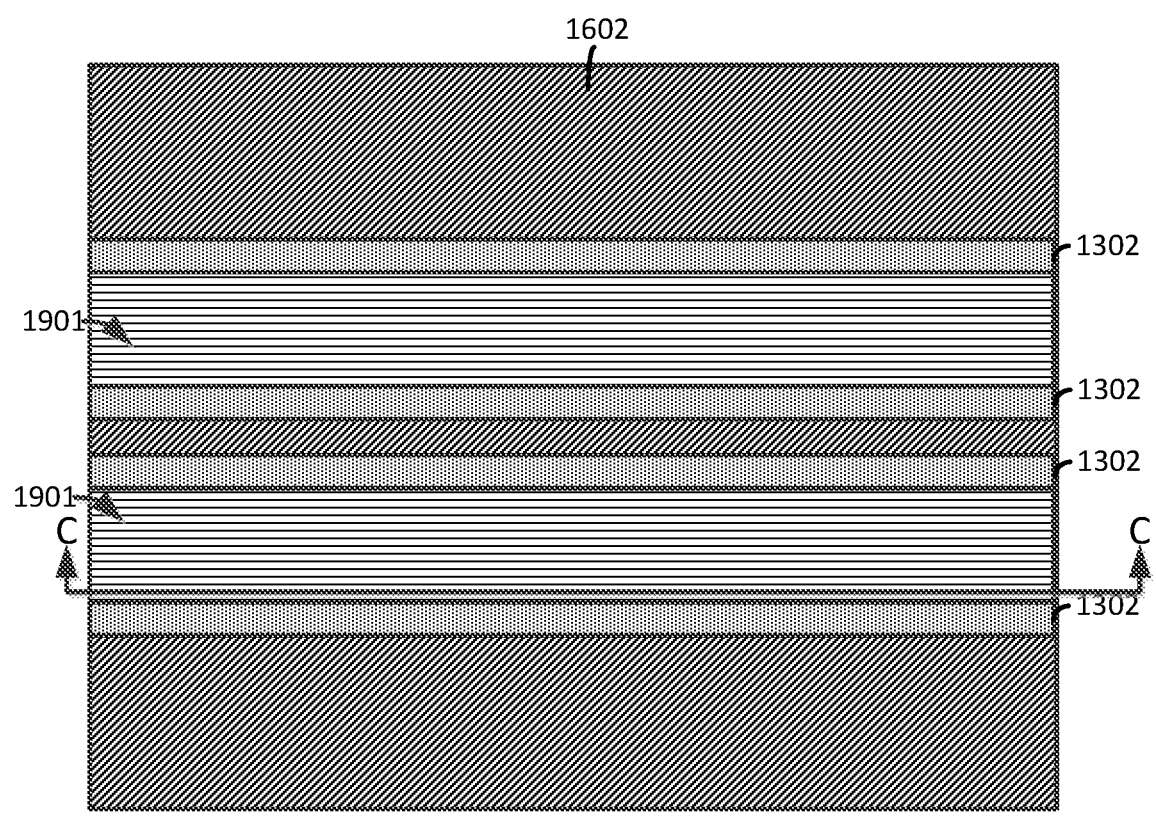
FIG. 19A illustrates a top view of the resultant structure following the formation of a replacement metal gate stack (gate stack).
Figure 19B:
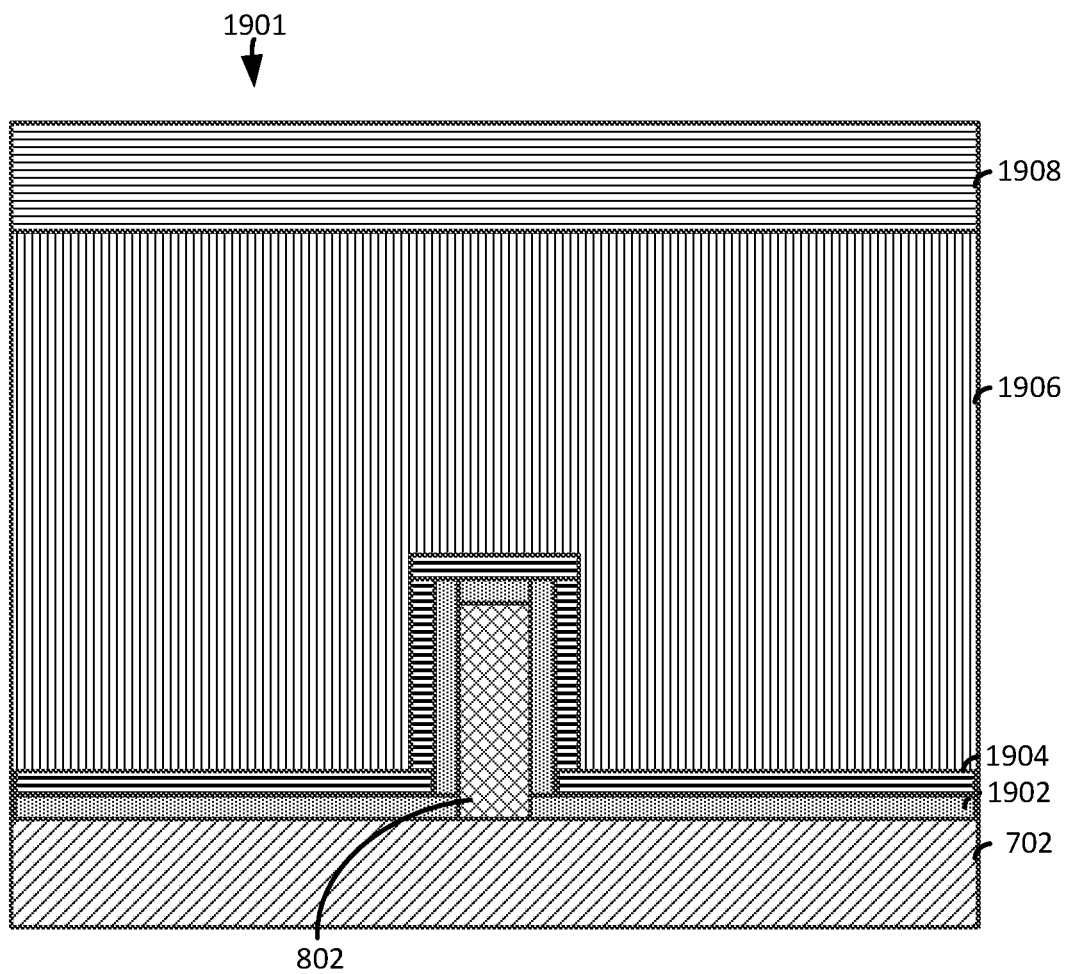

FIG. 19A illustrates a top view of the resultant structure following the formation of a replacement metal gate stack (gate stack) 1901. FIG. 19B illustrates a cut-away view of the gate stack 1901 along the line C-C (of FIG. 19A). The gate stack 1901 include high-k metal gates formed, for example, by filling the cavity 1802 (of FIG. 18) with one or more gate dielectric 1902 materials, one or more workfunction metals 1904, and one or more metal gate conductor 1906 materials. The gate dielectric 1902 material(s) can be a dielectric material having a dielectric constant greater than 3.9, 7.0, or 10.0. Non-limiting examples of suitable materials for the dielectric 1902 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 1902 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 1904 may be disposed over the gate dielectric 1902 material. The type of work function metal(s) 1904 depends on the type of transistor and may differ between the nFET and pFET devices. Non-limiting examples of suitable work function metals 1904 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 1906 material(s) is deposited over the gate dielectric 1902 materials and work function metal(s) 1904 to form the gate stack 1901. Non-limiting examples of suitable conductive metals include aluminum (Al), platinum (Pt), gold (Au), tungsten (W), titanium (Ti), or any combination thereof. The gate conductor 1906 material(s) may be deposited by a suitable deposition process, for example, CVD, PECVD, PVD, plating, thermal or e-beam evaporation, and sputtering.

Following the deposition of the gate dielectric 1902 materials, the work function metal(s) 1904, and the gate conductor 1906 material(s), planarization process, for example, chemical mechanical planarization (CMP), is performed to remove the overburden of the deposited gate materials and form the gate stack 1901. A gate cap 1908 is arranged on the replacement metal gate stacks 1901.

After the gate stack 1901 is formed, additional insulating material (not shown) may be deposited over the device(s). The insulating material may be patterned to form cavities (not shown) that expose portions of the source/drain region 1502 and the gate stack 1901. The cavities may be filled by a conductive material (not shown) and, in some embodiments, a liner layer (not shown) to form conductive contacts (not shown).

The methods and resultant structures described herein provide for forming gate stacks of finFET devices with a tight pitch. The methods use a process to form a hydrogen annealed surface on the sidewalls of the sacrificial gate stacks. The hydrogen annealed surface provides a surface for selectively depositing spacer material on the sidewalls of the sacrificial gates. The spacer material is thus formed as desired along the sidewalls of the sacrificial gates, and is not substantially deposited on the fin surfaces.

The methods and resultant structures provide for forming spacers without undesirable spacer material being arranged on active surfaces of the device.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a semiconductor fin arranged on a substrate;
an oxide layer arranged on the semiconductor fin;
a gate stack arranged over a channel region of the semiconductor fin;
a spacer arranged adjacent to the gate stack on the oxide layer, wherein the spacer is also arranged adjacent to a hydrogen terminated surface;
and
a source/drain region arranged adjacent to the spacer.

2. The semiconductor device of claim 1, further comprising a hardmask, wherein the hardmask has a width that is greater than a width of a region of the gate stack.

3. The semiconductor device of claim 1, wherein the fin includes a semiconductor material.

4. The semiconductor device of claim 1, further comprising an oxide layer formed over the fin.

5. The semiconductor device of claim 1, wherein an oxide layer from the channel region of the fin is removed prior to forming the gate stack over the channel region of the fin.

6. The semiconductor device of claim 1, wherein the spacer includes a nitride material.

7. The semiconductor device of claim 1, wherein the spacer is an atomic layer deposed spacer.

8. The semiconductor device of claim 1, further comprising a source/drain region formed over the fin prior beneath a formed insulator layer over portions of the fin.

* * * * *